United States Patent
Shen et al.

(10) Patent No.: US 9,203,443 B2
(45) Date of Patent: *Dec. 1, 2015

(54) OPTIMAL PERIOD RATE MATCHING FOR TURBO CODING

(71) Applicant: BROADCOM CORPORATION, Irvine, CA (US)

(72) Inventors: Ba-Zhong Shen, Irvine, CA (US); Tak K. Lee, Irvine, CA (US)

(73) Assignee: BROADCOM CORPORATION, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/522,257

(22) Filed: Oct. 23, 2014

(65) Prior Publication Data

US 2015/0046778 A1   Feb. 12, 2015

Related U.S. Application Data

(63) Continuation of application No. 12/020,016, filed on Jan. 25, 2008, now Pat. No. 8,904,265.

(60) Provisional application No. 60/927,264, filed on May 2, 2007.

(51) Int. Cl.
| | |
|---|---|
| *H03M 13/03* | (2006.01) |
| *H03M 13/00* | (2006.01) |
| *H03M 13/29* | (2006.01) |
| *H03M 13/47* | (2006.01) |
| *H04L 1/00* | (2006.01) |
| *H03M 13/25* | (2006.01) |

(52) U.S. Cl.
CPC ........ *H03M 13/6381* (2013.01); *H03M 13/258* (2013.01); *H03M 13/2957* (2013.01); *H03M 13/47* (2013.01); *H03M 13/635* (2013.01); *H04L 1/0041* (2013.01); *H04L 1/0066* (2013.01); *H04L 1/0068* (2013.01)

(58) Field of Classification Search
CPC .......... H03M 13/2957; H03M 13/625; H03M 13/0005; H03M 13/6381; H03M 13/635; H03M 13/005; H04L 1/0068
USPC .......................................... 714/746, 755, 790
See application file for complete search history.

(56) References Cited

U.S. PATENT DOCUMENTS

| | | | | |
|---|---|---|---|---|
| 6,000,054 A | * | 12/1999 | Bahr et al. ................... | 714/786 |
| 6,023,783 A | * | 2/2000 | Divsalar et al. ............... | 714/792 |
| 6,088,387 A | * | 7/2000 | Gelblum et al. .............. | 375/222 |
| 6,166,667 A | * | 12/2000 | Park .............................. | 714/755 |

(Continued)

*Primary Examiner* — Shelly A Chase
(74) *Attorney, Agent, or Firm* — Garlick & Markison; Bruce Stuckman

(57) ABSTRACT

Optimal period rate matching for turbo coding. A means is provided herein by which a nearly optimal (e.g., optimal for one block size and sub-optimal for others) periodic puncturing pattern that depends on a mother code. Any desired rate matching can be achieved using the means and approaches presented herein to ensure an appropriate rate of an encoded block output from a turbo encoder so that the subsequently modulated signal generated there from has the appropriate rate. In addition, some embodiments can also employ shifting for another design level available in accordance with puncturing employed to provide for periodic rate matching. Selectivity can also be employed, such that, a first periodic puncturing pattern can be applied at a first time to ensure a first rate, and a second periodic puncturing pattern can be applied at a second time to ensure a second rate.

20 Claims, 11 Drawing Sheets

(56) References Cited

U.S. PATENT DOCUMENTS

| | | | |
|---|---|---|---|
| 6,189,123 B1 * | 2/2001 | Nystrom et al. | 714/751 |
| 6,272,183 B1 * | 8/2001 | Berens et al. | 375/262 |
| 6,289,486 B1 * | 9/2001 | Lee et al. | 714/788 |
| 6,308,294 B1 * | 10/2001 | Ghosh et al. | 714/751 |
| 6,332,209 B1 * | 12/2001 | Eroz et al. | 714/790 |
| 6,366,601 B1 * | 4/2002 | Ghosh et al. | 375/130 |
| 6,430,722 B1 * | 8/2002 | Eroz et al. | 714/755 |
| 6,456,611 B1 * | 9/2002 | Hu et al. | 370/342 |
| 6,519,732 B1 * | 2/2003 | Li | 714/755 |
| 6,643,331 B1 * | 11/2003 | Farrell et al. | 375/261 |
| 6,728,927 B2 * | 4/2004 | Crozier | 714/790 |
| 6,903,665 B2 * | 6/2005 | Akhter et al. | 341/50 |
| 7,096,404 B2 * | 8/2006 | Eroz et al. | 714/755 |
| 7,251,285 B2 * | 7/2007 | Lee et al. | 375/262 |
| 7,849,377 B2 * | 12/2010 | Hekstra et al. | 714/752 |

\* cited by examiner

OPTIMAL PERIOD RATE MATCHING FOR TURBO CODING

CROSS REFERENCE TO RELATED PATENTS/PATENT APPLICATIONS

The present U.S. Utility patent application claims priority pursuant to 35 U.S.C. §120 as a continuation of U.S. Utility application Ser. No. 12/020,016, entitled "OPTIMAL PERIOD RATE MATCHING FOR TURBO CODING", filed Jan. 25, 2008, which claims priority pursuant to 35 U.S.C. §119(e) to U.S. Provisional Application No. 60/927,264, entitled "OPTIMAL PERIOD RATE MATCHING FOR TURBO CODING", filed May 2, 2007, both of which are hereby incorporated herein by reference in their entirety and made part of the present U.S. Utility patent application for all purposes.

BACKGROUND OF THE INVENTION

1. Technical Field of the Invention

The invention relates generally to communication systems; and, more particularly, it relates to communication systems employing turbo coding.

2. Description of Related Art

Data communication systems have been under continual development for many years. One such type of communication system that has been of significant interest lately is a communication system that employs iterative error correction codes. Of those, one particular type of communication system that has received interest in recent years has been one which employs turbo codes (one type of iterative error correcting code). Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

The use of turbo codes providing such relatively lower error rates, while operating at relatively low data throughput rates, has largely been in the context of communication systems having a large degree of noise within the communication channel and where substantially error free communication is held at the highest premium. Some of the earliest application arenas for turbo coding were space related where accurate (i.e., ideally error free) communication is often deemed an essential design criterion. The direction of development then moved towards developing terrestrial-applicable and consumer-related applications. Still, based on the heritage of space related application, the focus of effort in the turbo coding environment then continued to be achieving relatively lower error floors, and not specifically towards reaching higher throughput.

More recently, focus in the art has been towards developing turbo coding, and variants thereof, that are operable to support higher amounts of throughput while still preserving the relatively low error floors offered within the turbo code context.

Generally speaking, within the context of communication systems that employ turbo codes, there is a first communication device at one end of a communication channel with encoder capability and second communication device at the other end of the communication channel with decoder capability. In many instances, one or both of these two communication devices includes encoder and decoder capability (e.g., within a bi-directional communication system).

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Figure 1:
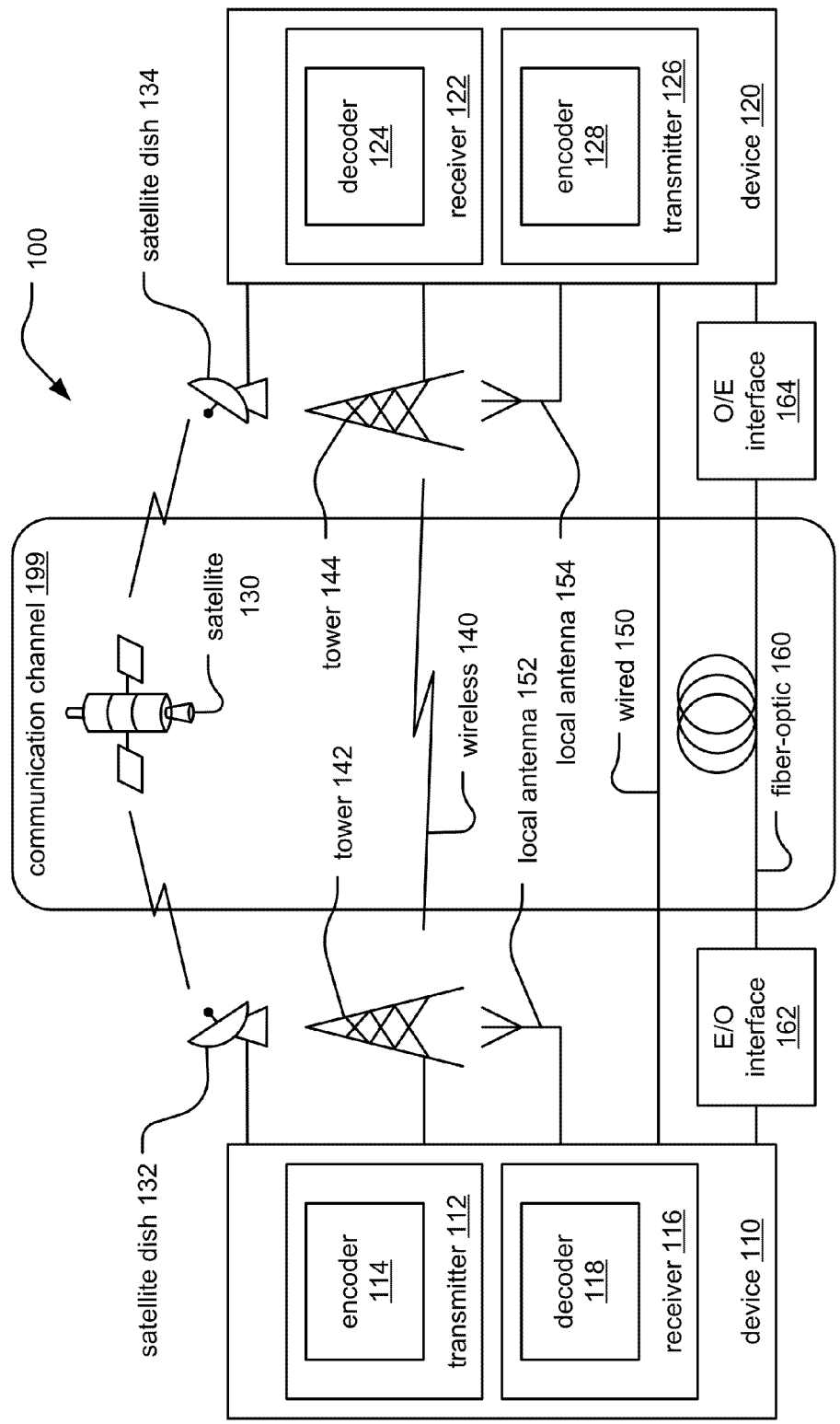
FIG. 1 illustrates an embodiment of a communication system.

Many communication systems incorporate the use of a turbo code. There are many potential applications that can employ turbo codes (including those variations and embodiments described herein). Means are presented herein that can be applied to the 3GPP LTE channel coding to support an arbitrary number of information bits. Some examples of the number of bits, though not limited thereto, that can be supported using the various aspects of the invention presented herein are 40 to 5114 for WCDMA (Wideband Code Division Multiple Access) and HSDPA (High-Speed Downlink Packet Access) and more for LTE (Long Term Evolution) (referenced also below). Alternatively, other examples of the number of bits, though not limited thereto, that can be supported using the various aspects of the invention presented herein are 40 to 6114 or 40 to 8192, or any other desirable number of bits as selected for a particular application.

Additional information regarding the UTRA-UTRAN Long Term Evolution (LTE) and 3GPP System Architecture Evolution (SAE) can be found at the Internet web site OF THE $3^{RD}$ Generation Partnership Project (3GPP).

Turbo coding was suggested for 3GPP LTE channel coding. Within the channel coding system in 3GPP LTE, there is a need and desire to supply and provide for a wide range of block sizes (i.e., turbo code block lengths). For this coding system, the algebraic interleave referred to as the "almost regular permutation (ARP)" in reference [5] was considered as one of the candidates, and "quadratic polynomial permutation (QPP)" in reference [6] seems to be the one adopted as the actual candidate for 3GPP LTE channel coding.

A very brief description of the QPP interleave is provided here:

Quadratic Polynomial Permutation (QPP)

Additional details regarding the quadratic polynomial permutation (QPP) interleave ($\pi$) are presented below.

Let a turbo code block size, or an interleave size of the turbo code be L, then if the following function $$\pi(x) = f_1 x + f_2 x^2 \mod(L)$$

where $f_1$ and $f_2$ are non-negative integers, is said to be a QPP over the ring permutation on $Z_L = \{0, 1, \ldots, L-1\}$, when $f(x)$ permutes $\{0, 1, \ldots, L-1\}$. This is referred to as a quadratic polynomial as described in reference [6].

Denote the set of prime numbers by $P = \{2, 3, \ldots\}$. Denote $$L = \prod_{p \in P} p^{n_{L,p}}.$$

Then a necessary and sufficient condition[5] for $f(x)$ to be QPP is 1) when $n_{L,2} \neq 1$, $\gcd(f_1, L) = 1$ and $$f_2 = \prod_{p \in P} p^{n_{f_2, p}}$$

such that $n_{f_2, p} \geq 1$ if $n_{L,p} \geq 1$;

2) when $n_{L,2} = 1$, $f_1 + f_2$ is odd, $\gcd(f_1, N/2) = 1$ and $$f_2 = \prod_{p \in P} p^{n_{f_2, p}}$$

such that $p \neq 2$ and $n_{f_2, p} \geq 1$ if $n_{L,p} \geq 1$.

Furthermore, the turbo decoding of this system generally needs to be implemented using a parallel decoding arrangement because of the very high data throughput and large block size desired for 3GPP LTE channel coding. The parallel decoding requires the collision-free memory accessing (i.e., any one turbo decoder (of a group of parallel arranged turbo decoders) accesses only memory (of a group of parallel arranged memories) at any given time).

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and other types of media as well.

FIG. 1 is a diagram illustrating an embodiment of a communication system 100.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

In a channel coding system with a lower rate mother code, such as 1/3 in 3GPP LTE, a rate matching algorithm produces a puncturing or repeating pattern for a codeword encoded by the mother code. After puncturing or repetition, the final output matches the rate needed.

Several puncturing approaches for rate matching are proposed in the references [1, 2, and 3] for channel coding in 3GPP LTE. Herein, a novel approach is provided by which puncturing approaches are translated to periodic puncturing approaches.

With this translation found, it is observed that these turbo codes mentioned above (e.g., in references [1, 2, and 3]) are not designed based on the turbo code defined in the 3GPP LTE standard, but only on rate and block size. This subsequently causes non-optimal (i.e., less than optimal) performance in HARQ (hybrid automatic repeat request).

In this disclosure, a means is provided by which a nearly optimal (e.g., optimal for one block size and sub-optimal for others) periodic puncturing pattern that depends on the mother code. In alternative embodiments, this means can be extended to find the optimal periodic puncturing pattern for each and every desired block size of a turbo coded signal. In addition, some embodiments can also employ shifting for another design level available in accordance with puncturing employed to provide for periodic rate matching.

Periodic Puncturing and its Generalization:

Periodic Puncturing pattern: Consider a rate 1/k mother turbo code that has L information bits, say, $x_{0,0}, x_{0,1}, \ldots, x_{0,L-1}$, and (k−1) parity sequences of L bits, say $x_{1,0}, \ldots, x_{1,L-1}, x_{2,0}, \ldots, x_{2,L-1}, \ldots, x_{k-1,0}, \ldots, x_{k-1,L-1}$ respectively. Suppose the puncturing period is q, then a puncturing pattern is a set of k binary vectors of size q, namely $$P_i = (e_{i,0}, e_{i,1}, \ldots, e_{i,q-1}), e_{i,j} \in \{0,1\}, i=0, \ldots, k-1, j=0, \ldots, q-1 \quad \text{(EQ-1)}$$

The periodic puncturing based on the above puncturing pattern can be defined as the k sequences $y_{i,0}, y_{i,1}, \ldots y_{i,L-1}$, $i=0, \ldots, k-1$, such that $$y_{i,j} = \begin{cases} x_{i,j} & \text{if } e_{i,j \bmod q} = 1 \\ \delta & \text{if } e_{i,j \bmod q} = 0 \end{cases}, \quad \text{(EQ-2)}$$

$$i = 0, \ldots, k-1, j = 0, \ldots, L-1$$

Then the final output sequences after puncturing are those $y_{i,j}$ such that $y_{i,j} \neq \delta$.

On top of this, we add k shifting numbers, say $s_0, \ldots, s_{k-1}$. The punctured sequence with these shifting positions and the pattern given in (EQ-1) is as follows:

$$y_{i,j} = \begin{cases} x_{i,j} & \text{if } e_{i,j+s_i \bmod q} = 1 \\ \delta & \text{if } e_{i,j+s_i \bmod q} = 0 \end{cases}, \quad \text{(EQ-3)}$$

$$i = 0, \ldots, k-1, j = 0, \ldots, L-1.$$

In the following using the methods provided in references [1, 2, 3] are modified so that they are applicable to the periodic puncturing.

EXAMPLE 1

Consider a rate 1/3 mother code (e.g., k=3). Let the interleaver (π) block size/information block size be 1120. Consider the 2 different rate matching algorithms in references [1, 2]. Although in the definition it is not mentioned that these rate matching method is periodic, they can be translated to the periodic puncturing pattern.

The notation for the sequences is as follows:

$P_0$ (for systematic bits);

$P_1$ (for redundancy/parity/check bits output from $1^{st}$ constituent encoder); and $P_2$ (for redundancy/parity/check bits output from $2^{nd}$ constituent encoder).

Release 6 rate matching [1]: The period is 8 and period pattern is $P_0$=(11111111);
$P_1$=(00000001);
$P_2$=(00000001);

with shifting positions 0, 3, 6.

Circular buffer [2]: The period is 32 and period pattern is $P_0$=(01111111111111101111111111111111);
$P_1$=(00010001000000010000000100000001);
$P_2$=(00010001000000010000000100000001).

For an improvement to this approach, it is suggested to combine this approach with the shift method given above with respect to (EQ-3).

Moreover, every sub-sequence $x_{i,0}, \ldots, x_{i,L-1}$ $i=0, 1, \ldots, k-1$, can have combined periodic patterns. There are at least two possible ways to combine.

Combining Method 1) Suppose for every i, there are $m_i$ different patterns, namely $P_{i,0}, \ldots, P_{i,m_i-1}$ with periods $q_{i,l}$ $l=0, \ldots, m_i-1$, respectively. Divide the whole sequence to $m_i$ parts with sizes, $L_{i,0}, \ldots, L_{i,m_i-1}$, such that $$\sum_{l=0}^{m_i} L_{i,l} = L.$$

Then the sequence can be represented as follows:

$$x'_{i,0,0}, \ldots, x'_{i,0,L_{i,0}-1}, x'_{i,1,0}, \ldots, x'_{i,1,L_{i,1}-1}, \ldots, x'_{i,m_i-1,0}, \ldots,$$

$$x'_{i,m_i-1,L_{i,m_i-1}-1},$$

Such that $x'_{i,u,0}, x'_{i,u,1}, \ldots, x'_{i,u,L_{i,u}-1} = x_{i,M_u}, x_{i,M_u+1} \ldots,$ $x_{i,M_u+L_{i,u}-1},$ where M=0 if u=0, otherwise $$M_u = \sum_{v=0}^{u-1} L_{i,v}.$$

Finally, the periodic puncturing pattern, $P_{i,u}$, is used to puncture the sequence $x'_{i,u,0}, x'_{i,u,1}, \ldots, x'_{i,u,L_{i,u}-1}$.

EXAMPLE 1 (CONTINUE)

Release 6 with dithering as in reference [3]: Period and pattern for the information bits sequence are 1 and $P_0$=(1). There are two patterns for every parity bit sequence.

$$L_{1,0} = L_{2,0} = \frac{4L}{7},$$

$$L_{1,1} = L - L_{1,0} = L_{2,1}.$$

$P_{1,0}$=$P_{2,0}$=(000010000100001000001)

of period 21; and $P_{1,1}$=$P_{2,1}$=(0001000100001) of period 13.

Combining Method 2) Suppose there are m different patterns, namely $P_{i,0}, \ldots, P_{i,m-1}$ with periods $q_{i,l}$ $l=0, \ldots, m_i-1$. Different to Combining method 1), using when this approach, puncturing patterns are alternatively used for all sequences, $x_{i,0}, \ldots, x_{i,L-1}$. With the given rate r, we can get the percentage ratio for different periods (see part 2 of Section 2 for the calculation for one possible set of periods). Let the interleaver (π) block size/information block size be L. Let us define $L_{i,j}$ to be the size of sub-block that uses the puncturing pattern $P_{i,j}$.

Then $$\sum_{l=0}^{m_i} L_{i,l} = L.$$

There can be several methods in accordance with this approach; some variants therein are depicted below.

Method 2.1) First $q_{i,0}$ bits use pattern $P_{i,0}$, the next $q_{i,1}$ bits use pattern $P_{i,1}$ and so on. When all $m_i$ patterns are used up, start from the first one again. When the size of sub-block punctured by pattern $P_{i,j}$ is equal to $L_{i,j}$, then skip the puncturing pattern $P_{i,j}$ for the next round.

Method 2.2) Suppose all the periods are equal, i.e. $q_{i,j}=q$, $i=0,\ldots,k-1, j=0,\ldots,m-1$ and L is a multiple of q, i.e., $L=q\tilde{L}$, and moreover, $L_{i,j}$ also divisible by q, i.e., $L_{i,j}=q\tilde{L}_{i,j}$. Define $$\tilde{L}_{i,j} = \frac{c_{i,j}}{C_i} L,$$

$j=0,\ldots,m-1, t=0,\ldots,k-1$, with $c_{i,j}, C_i$ being integers such that $$\sum_{j=0}^{m-1} c_{i,j} = C_i.$$

Let "cont_P" be a counter on the number of period. Now the puncturing method can be explained as follows:

If $0 \leq \text{cont\_p} \mod C_i < c_{i,0}$, use puncturing pattern $P_{i,0}$ and
If $$\sum_{v=0}^{j-1} c_{i,v} \leq \text{cont\_p} \mod C_i < \sum_{v=0}^{j} c_{i,v},$$

use puncturing pattern $P_{i,j}$ when $j>0$.

Optimal Periodic Puncturing and Combined Period Puncturing:

Herein, a rate matching method is presented that depends on the optimal periodic puncturing pattern for a given code and a manageable number of given code rates. For a code rate which is not in the given rate range, several sub-optimal methods based on the optimal pattern of the nearest code rates in the given range can be provided.

Figure 2:
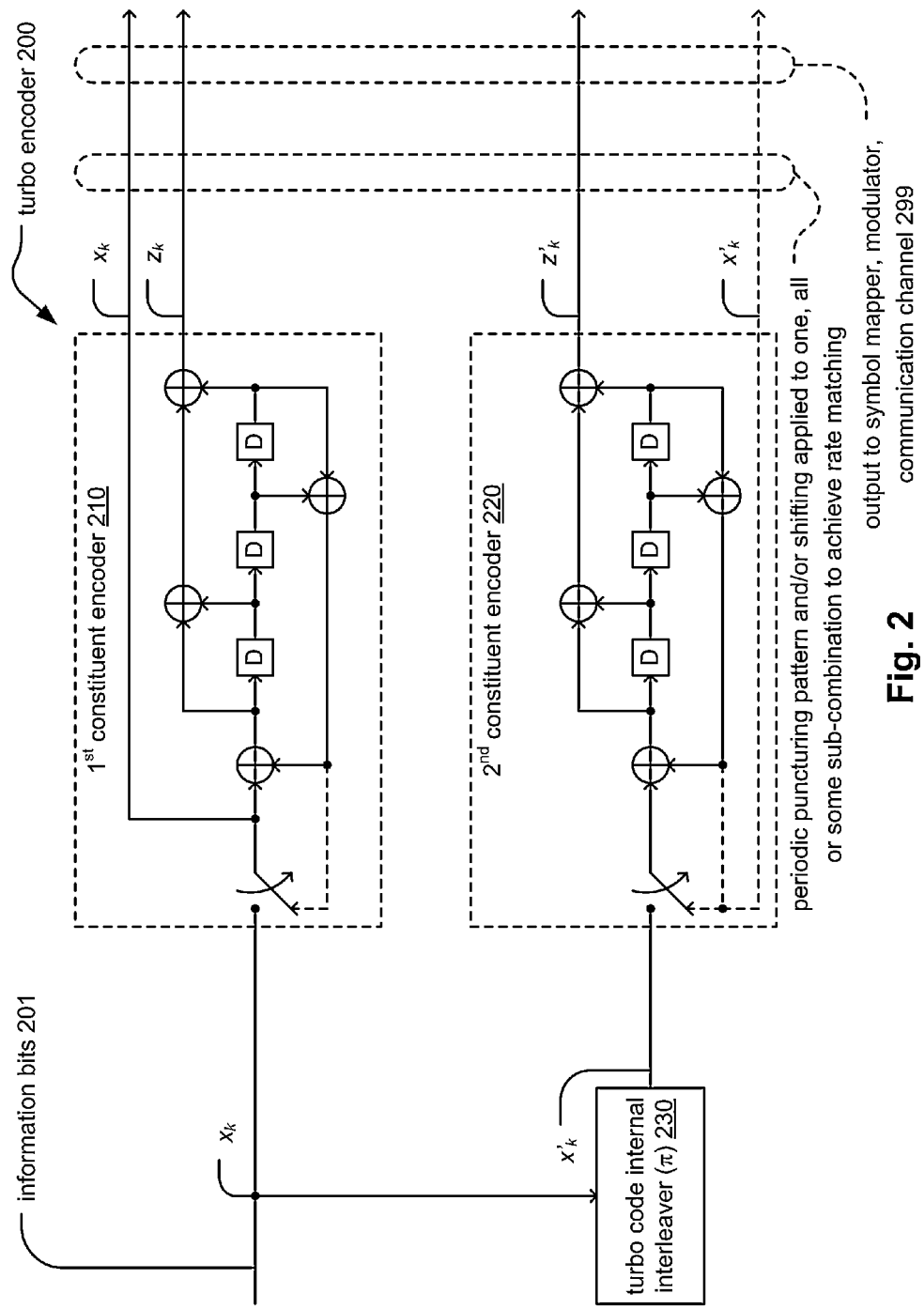
FIG. 2 illustrates an embodiment of a turbo encoding module.

FIG. 2 illustrates an embodiment of a turbo encoding module 200. This embodiment of turbo encoding is employed to explain this approach in accordance with the rate 1/3 turbo code in 3GPP LTE as described in reference [4] (e.g., according to FIG. 2).

Information bits 201, also shown as $x_k$, are provided to an interleaver ($\pi$) module 230 (e.g., that may be operable to employ a QPP interleave ($\pi$) as described above) that is operable to generate interleaved information, $x'_k$. Again, the interleave ($\pi$) employed by the interleaver ($\pi$) module 230 can be a QPP interleave ($\pi$) in some embodiments such as the interleaves ($\pi$) used in the QPP interleaves as described in reference [4] and as adopted by 3GPP LTE. Alternatively, other desired interleaves ($\pi$) can be employed by the interleaver ($\pi$) module 230 without departing from the scope and spirit of the invention.

These information bits 201 are also passed to a first constituent encoder 210 from which both the information bits 201, $x_k$, as well as check/redundancy/parity 1 bits, $z_k$, are output there from.

The interleaved information output from the interleaver ($\pi$) module 230 is also passed to a second constituent encoder 220 from which both the interleaved information, $x'_k$, as well as check/redundancy/parity 2 bits, $z'_k$, are output there from.

In the art, the parity bits output from a turbo encoder are sometimes referred to as check bits, parity bits, and/or redundancy bits. Moreover, the information bits output from a turbo encoder are sometimes referred to as the information bits (i.e., the very same as was provided to the turbo encoder). In a systematic code context, the information bits output from a turbo encoder are also sometimes referred to as systematic bits (e.g., in the context of a systematic encoder that, when encoding information bits, outputs those same information bits as well as check/redundancy/parity bits). Herein, parity bits is oftentimes employed for reference to these check/redundancy/parity bits output from a turbo encoder, and information bits is oftentimes employed for reference to these information/systematic bits output from a turbo encoder.

Each of the information bits 201, $x_k$, the parity 1 bits, $z_k$, and the parity 2 bits, $z'_k$, can be provided to a frame segmentation module or other means to generate an encoded block. Various other components (e.g., bit combining modules, puncturing modules, etc.) can also be situated as part of or after such as frame segmentation module to assist in the generation of an encoded block that may then be passed to a symbol mapper where the symbols are mapped according to the appropriate modulation (constellation and mapping). These symbol mapped symbols may then undergo any appropriate modulation as required to generate a continuous-time signal whose format comports with a communication channel 299 into which the turbo coded signal is to be launched.

It is also noted that the turbo encoding, puncturing, shifting and/or other operations (some of which are depicted within FIG. 2) can also be performed within a processing module, functional blocks, circuitry, hardware, and/or other means within a communication device.

It is also noted that any such communication device as described herein can also be implemented to store (e.g., such as in an embedded memory or memory coupled thereto) a plurality of periodic puncturing patterns that can includes a first periodic puncturing pattern, a second periodic puncturing pattern, etc.

For examples, a periodic puncturing pattern such as described herein can be applied to any one of the systematic bits or information bits 201, $x_k$, the check/redundancy/parity 1 bits, $z_k$, and the check/redundancy/parity 2 bits, $z'_k$. As desired in a particular application, the periodic puncturing pattern can be implemented to one, all or some sub-combination of these bits to ensure appropriate rate matching.

Single Optimal Period (e.g., for a Particular Selected Interleaver ($\pi$) Block Size/Information Block Size):

Since 188 QPP interleaves given in reference [4] are multiple of 8, this embodiment employs 8 as a puncturing period (e.g., a period of 8, q=8). Since the mother code is a rate 1/3 code (e.g., k=3), there are three sequences, namely, $x_{0,0}, \ldots, x_{0,L-1}$, $x_{1,0}, \ldots, x_{1,L-1}$, and $x_{2,0}, \ldots, x_{2,L-1}$.

Initially, the optimal periodic puncturing patterns for rate r=8/D, D=9, 10, 11, ..., 23 need to be constructed. The corresponding rates are as follows:

$$R_9=8/9, R_{10}=8/10, R=8/11, R_{12}=8/12=2/3, R_{13}=8/13,$$

$$R_{14}=8/14=4/7, R_{15}=8/15, R_{16}=8/16=1/2, R=8/17,$$

$$R_{18}=8/18=4/9, R_{19}=8/19, R_{20}=8/20=2/5, R_{21}=8/21,$$

$$R_{22}=8/22=4/11, R_{23}=8/23. \quad\quad (EQ-4)$$

Of course, to find an optimal pattern can provide to a very burdensome and challenging task. One possible approach is to do an exhaustive search within a given turbo code. In this way, a periodic puncturing pattern can be generated that is related to the given code, and yet will be different to those proposed rate matching algorithms as described in references [1, 2, 3].

EXAMPLE 2

Consider rate 1/3 mother turbo code as described in reference [1]. For rate 8/10=0.8 and period 8, it is found that the optimal periodic puncturing patterns for three bit sequences, $x_{0,0}, \ldots, x_{0,L-1}, x_{1,0}, \ldots, x_{1,L-1}$, and $x_{2,0}, \ldots, x_{2,L-1}$ are as follows:

$P_0=(11101111)$, $P_1=(01010000)$, $P_2=(00001000)$.

Oftentimes performance diagrams are described in the context of BLER (Block Error Rate) [or BER (Bit Error Rate)] versus $E_b/N_o$ (ratio of energy per bit $E_b$ to the Spectral Noise Density $N_o$). This term $E_b/N_o$ is one measure of SNR (Signal to Noise Ratio) for a digital communication system. Generally, a signal is not only one bit, and in that case, this can be represented alternatively by either $E_s/N_o$ (ratio of energy per symbol $E_s$ to the Spectral Noise Density $N_o$) or directly use SNR. When looking at such performance curves, the BLER [or BER] may be determined for any given $E_b/N_o$ (or SNR) thereby providing a relatively concise representation of the performance of the decoding approach.

Other of the following performance diagrams are described in the context of $E_b/N_o$ (ratio of energy per bit $E_b$ to the Spectral Noise Density $N_o$) versus interleaver size (e.g., interleaver (π) block size/information block size of the turbo coded signal).

Figure 3:
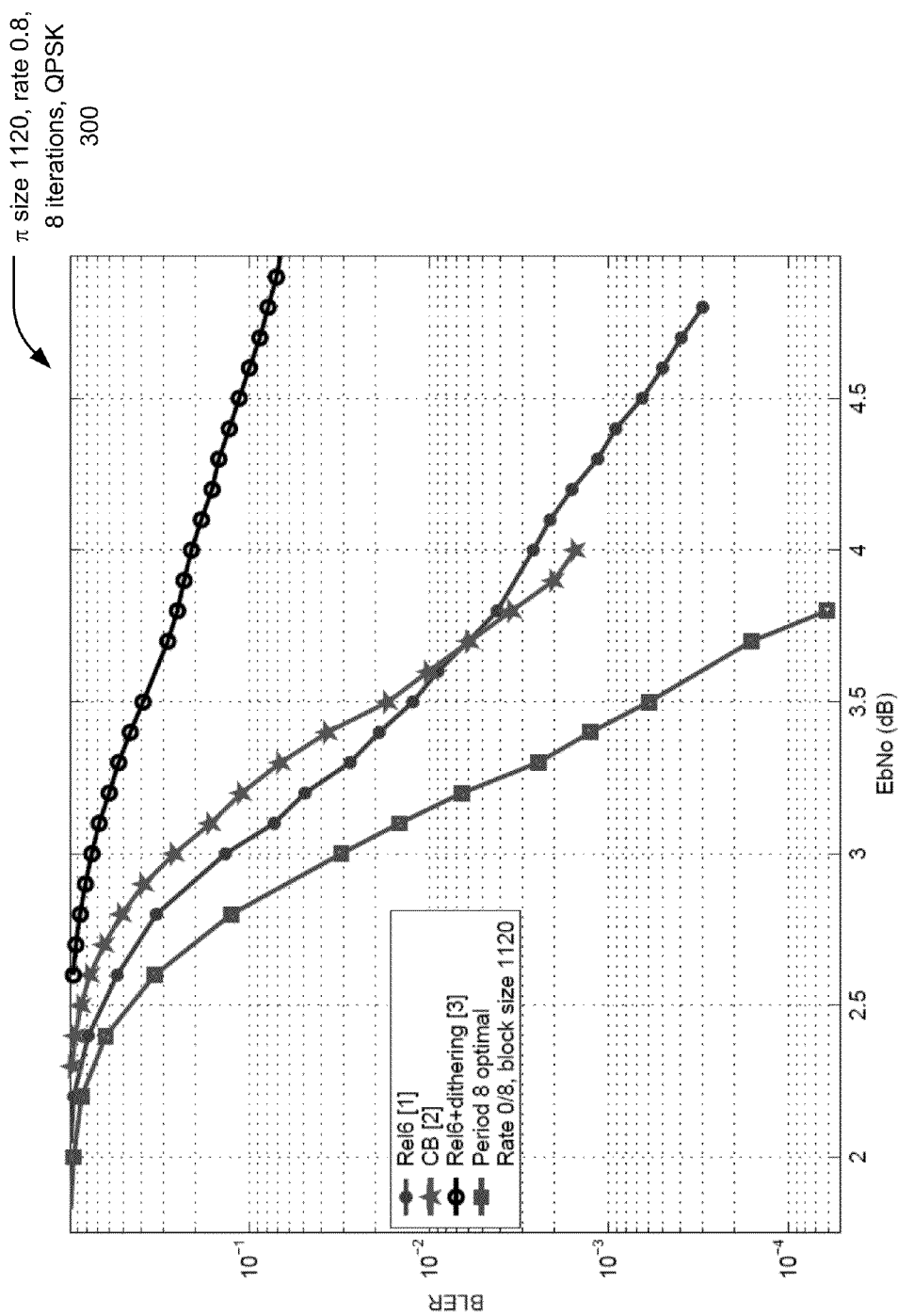
FIG. 3 illustrates an embodiment of performance comparisons (in terms of block error rate (BLER) vs. Eb/No (ratio of energy per bit to spectral noise density)) of various turbo codes having an interleaver ($\pi$) block size/information block size of 1120 and a code rate of 0.8.

The following FIG. 3 shows a large improvement in performance when compared to that as disclosed in references [1, 2, 3] for interleaver (π) block size/information block size 1120 with 8 iterations.

FIG. 3 illustrates an embodiment of performance comparisons (in terms of block error rate (BLER) vs. Eb/No (ratio of energy per bit to spectral noise density)) of various turbo codes having an interleaver (π) block size/information block size of 1120 and a code rate of 0.8.

The following 3 figures (FIG. 4, FIG. 5, and FIG. 6) show the improvement by using this optimal pattern for all 188 QPP interleaves for rate 0.8 on block error rate (BLER) of 0.1, 0.01 and 0.002, respectively, using QPSK (Quadrature Phased Shift Keying).

Figure 4:
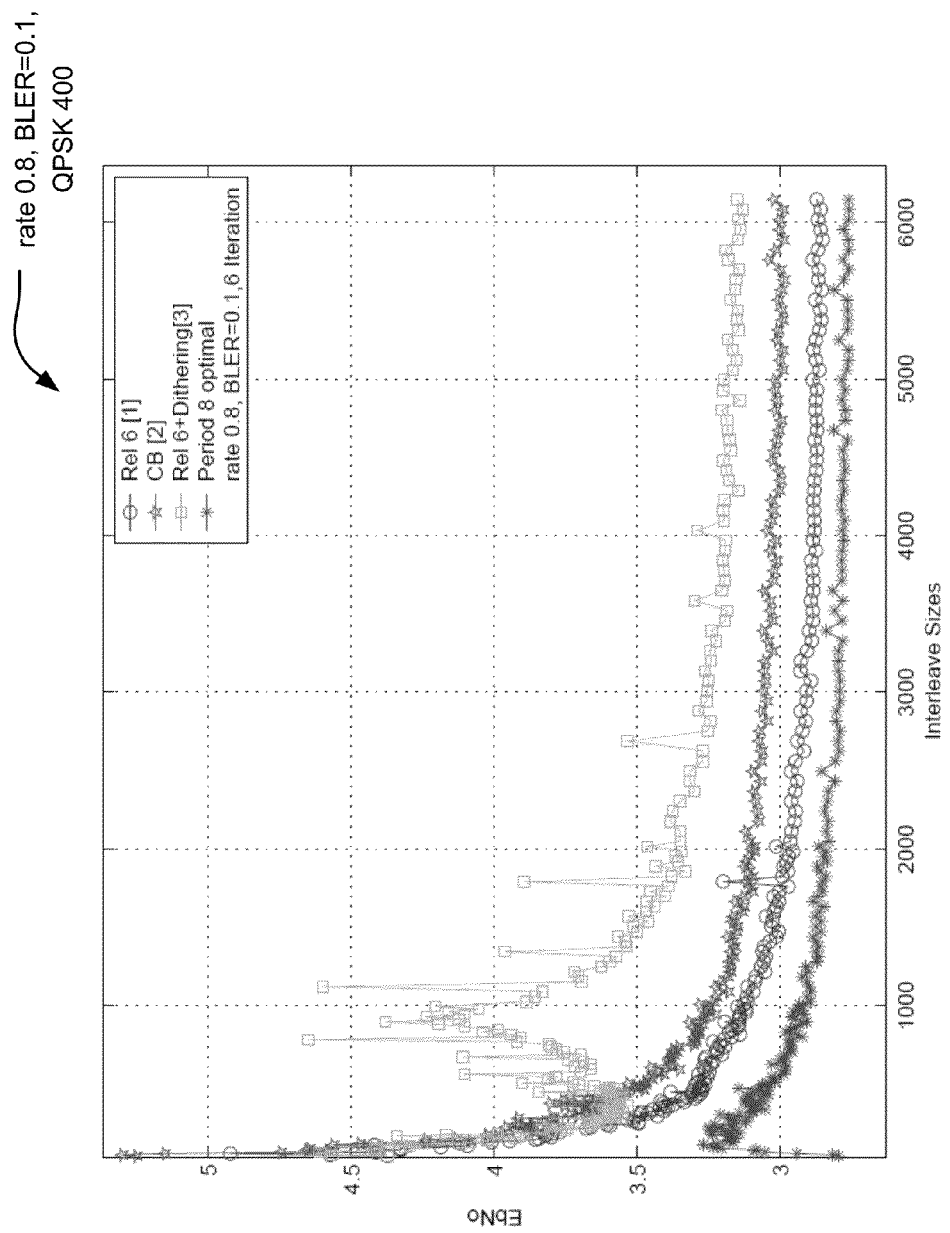
FIG. 4 illustrates an embodiment of performance comparisons (in terms of a constant BLER=0.1 of Eb/No vs. interleave sizes) of various turbo codes having a code rate of 0.8 having an interleaver ($\pi$) block size/information block size of 1120 and a code rate of 0.8.

FIG. 4 illustrates an embodiment of performance comparisons (in terms of a constant BLER=0.1 of Eb/No vs. interleave sizes) of various turbo codes having a code rate of 0.8 having an interleaver (π) block size/information block size of 1120 and a code rate of 0.8.

Figure 5:
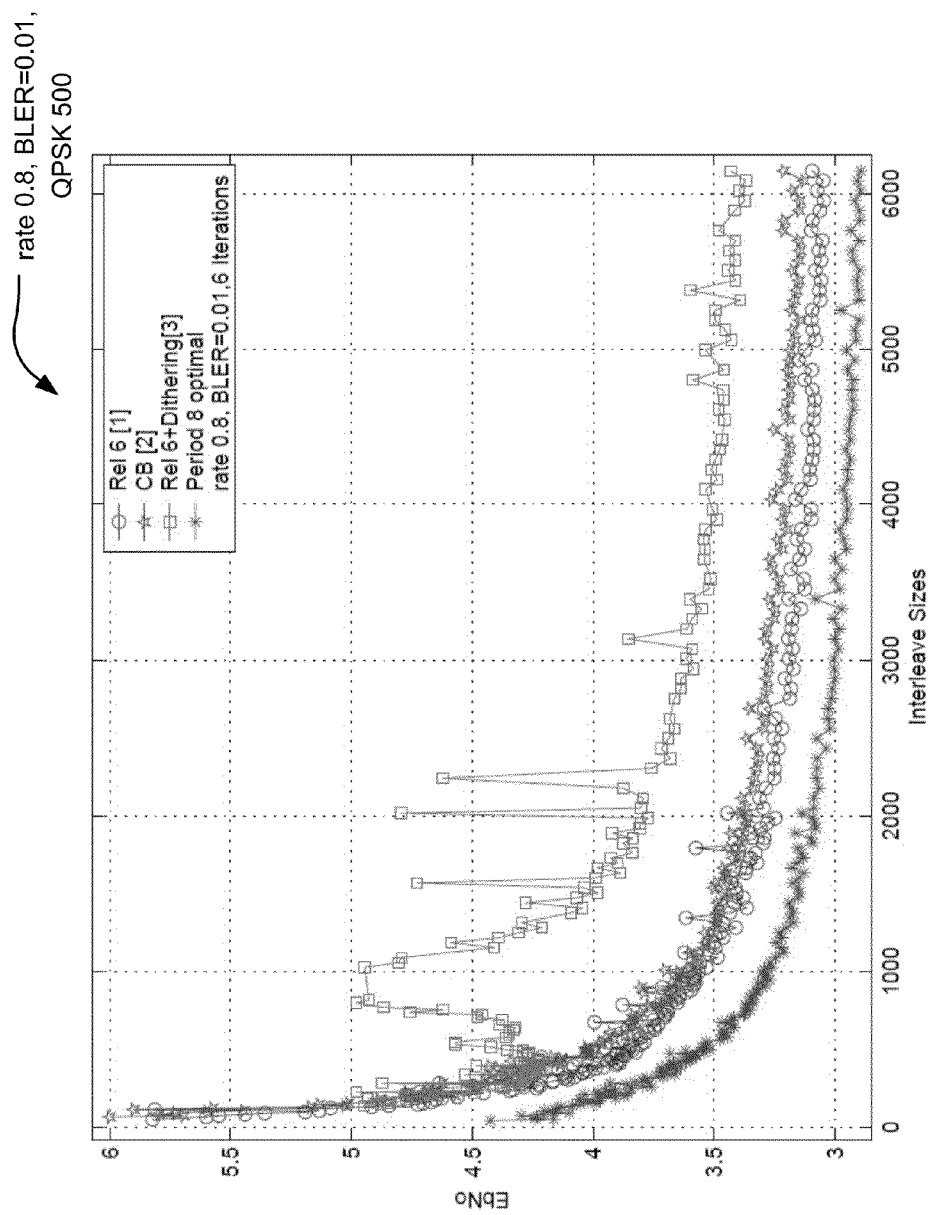
FIG. 5 illustrates an embodiment of performance comparisons (in terms of a constant BLER=0.01 of Eb/No vs. interleave sizes) of various turbo codes having a code rate of 0.8 having an interleaver ($\pi$) block size/information block size of 1120 and a code rate of 0.8.

FIG. 5 illustrates an embodiment of performance comparisons (in terms of a constant BLER=0.01 of Eb/No vs. interleave sizes) of various turbo codes having a code rate of 0.8 having an interleaver (π) block size/information block size of 1120 and a code rate of 0.8.

Figure 6:
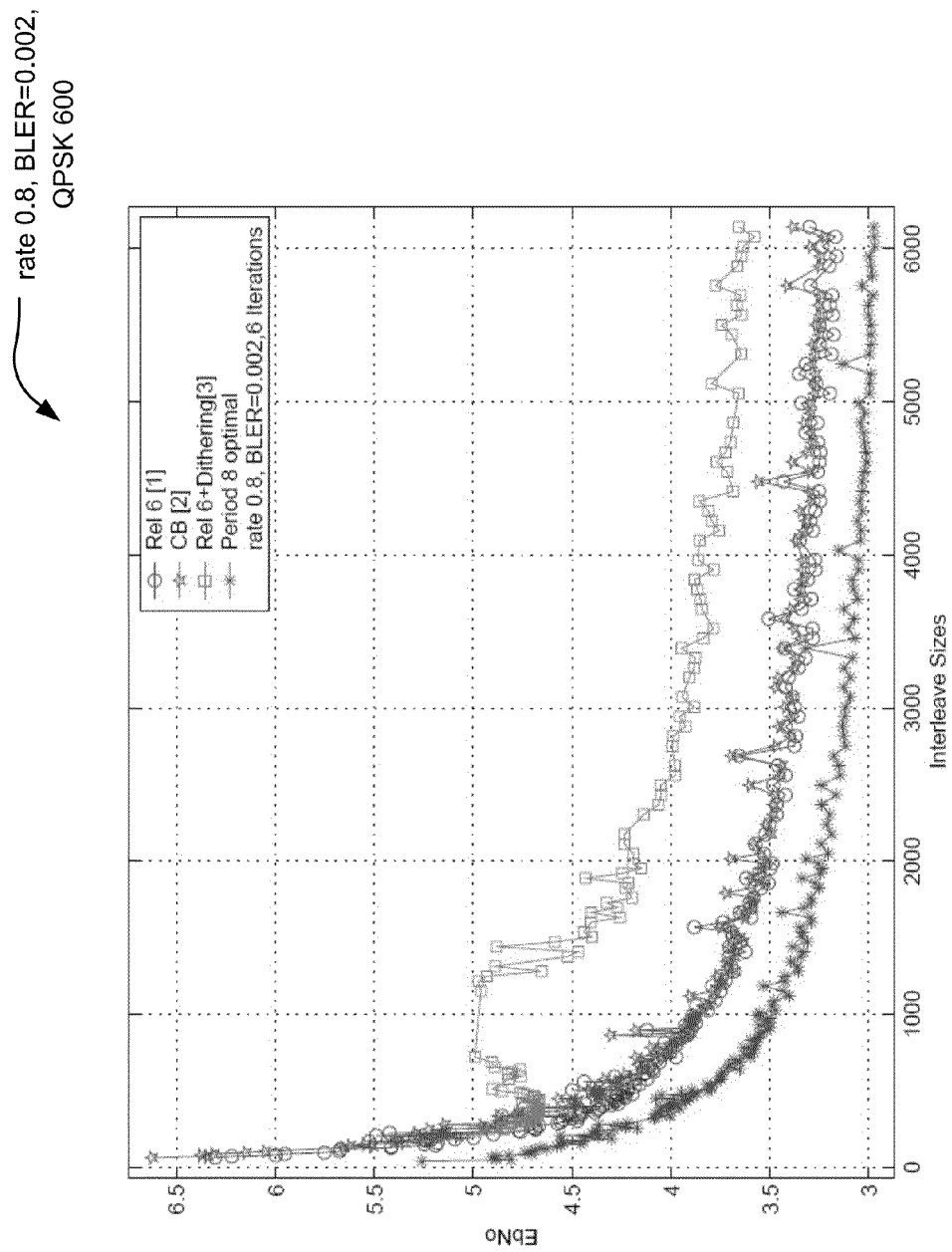
FIG. 6 illustrates an embodiment of performance comparisons (in terms of a constant BLER=0.002 of Eb/No vs. interleave sizes) of various turbo codes having a code rate of 0.8 having an interleaver ($\pi$) block size/information block size of 1120 and a code rate of 0.8.

FIG. 6 illustrates an embodiment of performance comparisons (in terms of a constant BLER=0.002 of Eb/No vs. interleave sizes) of various turbo codes having a code rate of 0.8 having an interleaver (π) block size/information block size of 1120 and a code rate of 0.8.

Combining Several Period Patterns:

To have puncturing pattern for a code rate not included in (EQ-4), the periodic puncturing patterns for the rates in (EQ-4) can nevertheless be used to obtain a sub-optimal periodic puncturing pattern. To find out how many periods are needed, one can use the following formula.

Suppose that the attempted code rate is r, and it is desired to use t provided optimal puncturing patterns $P_0, \ldots, P_{t-1}$ of rates $R_{D_0}=8/D_0, R_{D_1}=8/D_1, \ldots, R_{d_{t-1}}=8/D_{t-1}$, respectively, in (EQ-4). The percentage of the sub-blocks that use $P_0, \ldots, P_{t-1}$ are denoted respectively by $a_0, a_1, \ldots, a_{t-1}$. These numbers should satisfy the following equation $$\frac{1}{\sum_{u=0}^{t-1} \frac{a_u}{R_{D_u}}} = r \quad\quad (EQ-5)$$

such that $a_0+a_1+\ldots+a_{t-1}=1$.

EXAMPLE 3

Consider rate 1/3 mother turbo code as given in reference [1]. For code rate r=0.7 and period 8 (q=8), we use optimal the optimal $R_{10}=0.8=8/10$ puncturing patterns given in example 3, and choose the optimal $R_{12}=8/12=2/3$ pattern, which results in the following:

$P_{1,0}=(1111110)$, $P_{1,1}=(0110001)$, $P_{1,2}=(01000001)$.

Since this example involves the combining of two patterns, then $a_1=1-a_0$ and (EQ-5) becomes as follows:

$$\frac{1}{\frac{a_0}{R_{10}} + \frac{(1-a_0)}{R_{12}}} = 0.7$$

Thus, $a_0=2/7$ and $a_1=5/7$. By using Combining Method 2.2), the following 3 figures (FIG. 7, FIG. 8, and FIG. 9) show the performance gain of the sub-optimal combining method over the other 3 methods compared in the diagram (e.g., as described in references [1, 2, 3]).

A special case is when t=2, i.e., combine 2 patterns among the 15 patterns corresponded to the rates in (EQ-4). Before we give the detail, let us define two extreme rates, i.e. rate $R_8=8/8=1$ (all parity bits are punctured) and rate $R_{24}=1/3=8/24$ (no puncturing at all). Let r be any rate in the range (1,1/3) but not in the (EQ-4). Then there exists a number $u \in \{9, \ldots, 23, 24\}$ such that $R_{u-1} < r < R_u$. Compute $$a = u - \frac{8}{r} \quad\quad (EQ-4)$$

We may find integers c,C such that $$a = \frac{c}{C}.$$

Let "cont_P" be a counter on the number of periods and let $P_{u-1}$ be optimal pattern for rate $R_{u-1}$ and $P_u$ be the optimal pattern for rate $R_u$. The puncturing method can then be described as follows.

If cont_p mod C<c, use puncturing pattern $P_{u-1}$, otherwise use puncturing pattern $P_u$

EXAMPLE 3.1

Also consider rate r=0.7. Since this rate is between 8/11 and 8/12, we combine optimal $R_{11}$=8/11 puncturing pattern
$P_{0,0}$=(101111111), $P_{0,1}$=(01010001), $P_{0,2}$=(00000101)
And the optimal $R_{12}$=8/12=2/3 puncturing pattern:
$P_{1,0}$=(11110111), $P_{1,1}$=(10101000), $P_{1,2}$=(00001001)
Since u=12, we have $$a = u - \frac{8}{r} = 12 - 80/7 = 4/7$$

Thus, c=4 and C=7. Then
If cont_p mod 7<4, use puncturing pattern ($P_{0,0}$, $P_{0,1}$, $P_{0,2}$), otherwise use puncturing pattern ($P_{1,0}$, $P_{1,1}$, $P_{1,2}$)

Figure 7:
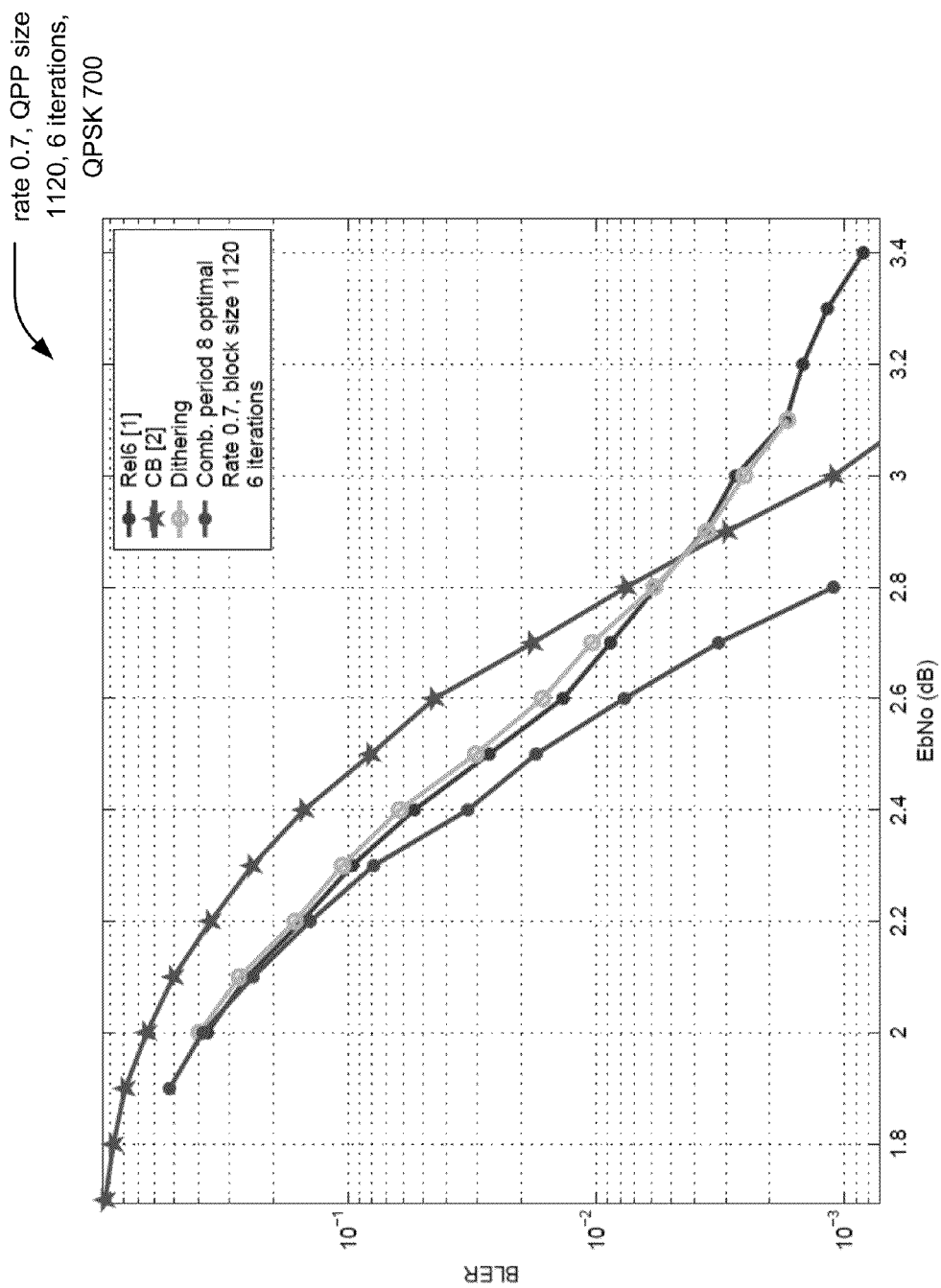
FIG. 7 illustrates an embodiment of performance comparisons (in terms of BLER vs. Eb/No) on a QPSK (Quadrature Phased Shift Keying) AWGN (Additive White Gaussian Noise) communication channel when performing 6 decoding iterations of a coded signal having an interleaver ($\pi$) block size/information block size of 1120 and a code rate of 0.7.

The following FIG. 7 shows the improvement to [1,2] and dithering algorithm on QPSK AWGN channel with 6 iterations on size 1120.

FIG. 7 illustrates an embodiment of performance comparisons (in terms of BLER vs. Eb/No) on a QPSK (Quadrature Phased Shift Keying) AWGN (Additive White Gaussian Noise) communication channel when performing 6 decoding iterations of a coded signal having an interleaver ($\pi$) block size/information block size of 1120 and a code rate of 0.7.

As can be seen, the following 3 figures (FIG. 8, FIG. 9, and FIG. 10) show the improvement by using this optimal pattern for all 188 QPP interleaves for rate 0.7 on block error rate (BLER) of 0.1, 0.01 and 0.002, respectively, using QPSK.

Figure 8:
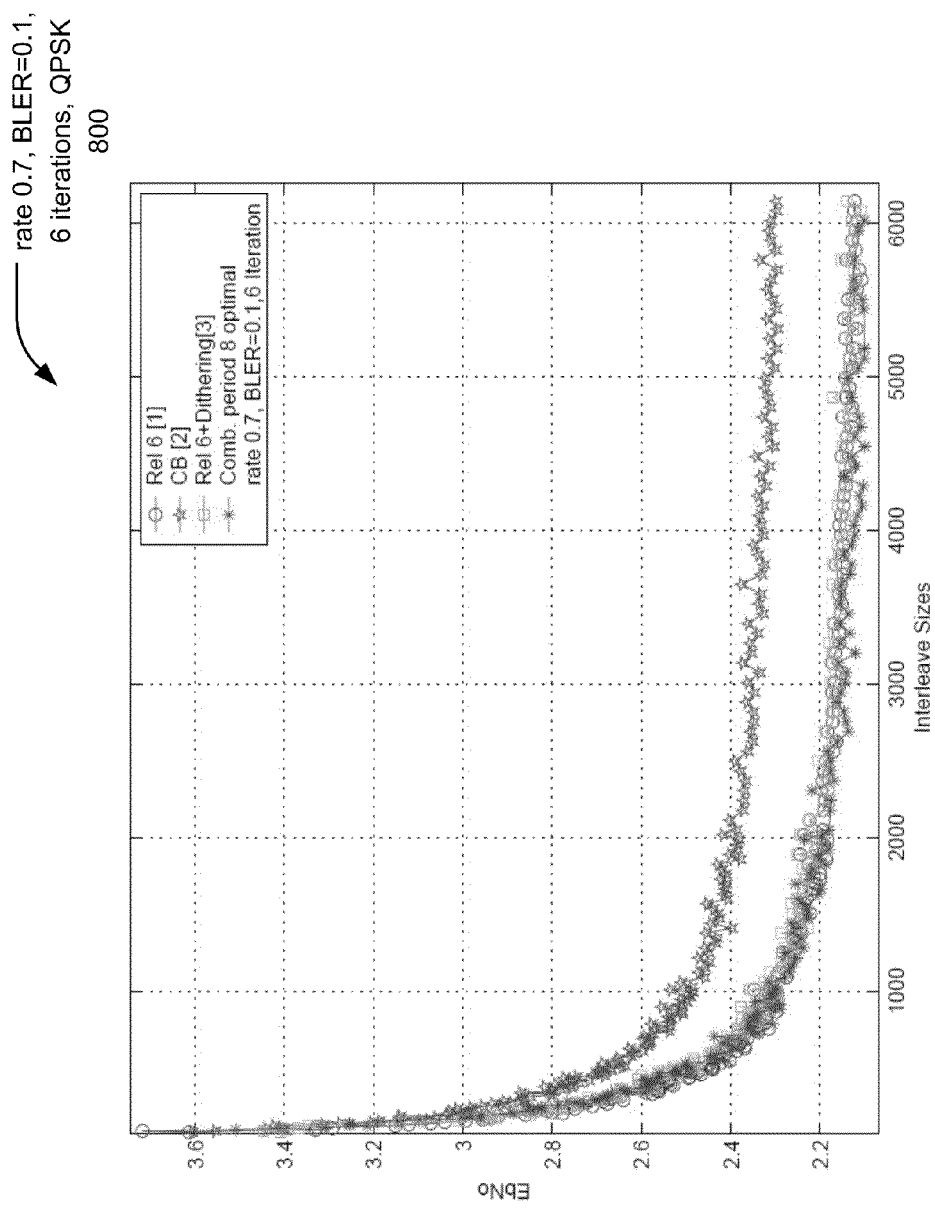
FIG. 8 illustrates an embodiment of performance comparisons (in terms of a constant BLER=0.1 of Eb/No vs. interleave sizes) of various turbo codes having a code rate of 0.8 having an interleaver ($\pi$) block size/information block size of 1120 and a code rate of 0.7.

FIG. 8 illustrates an embodiment of performance comparisons (in terms of a constant BLER=0.1 of Eb/No vs. interleave sizes) of various turbo codes having a code rate of 0.8 having an interleaver ($\pi$) block size/information block size of 1120 and a code rate of 0.7.

Figure 9:
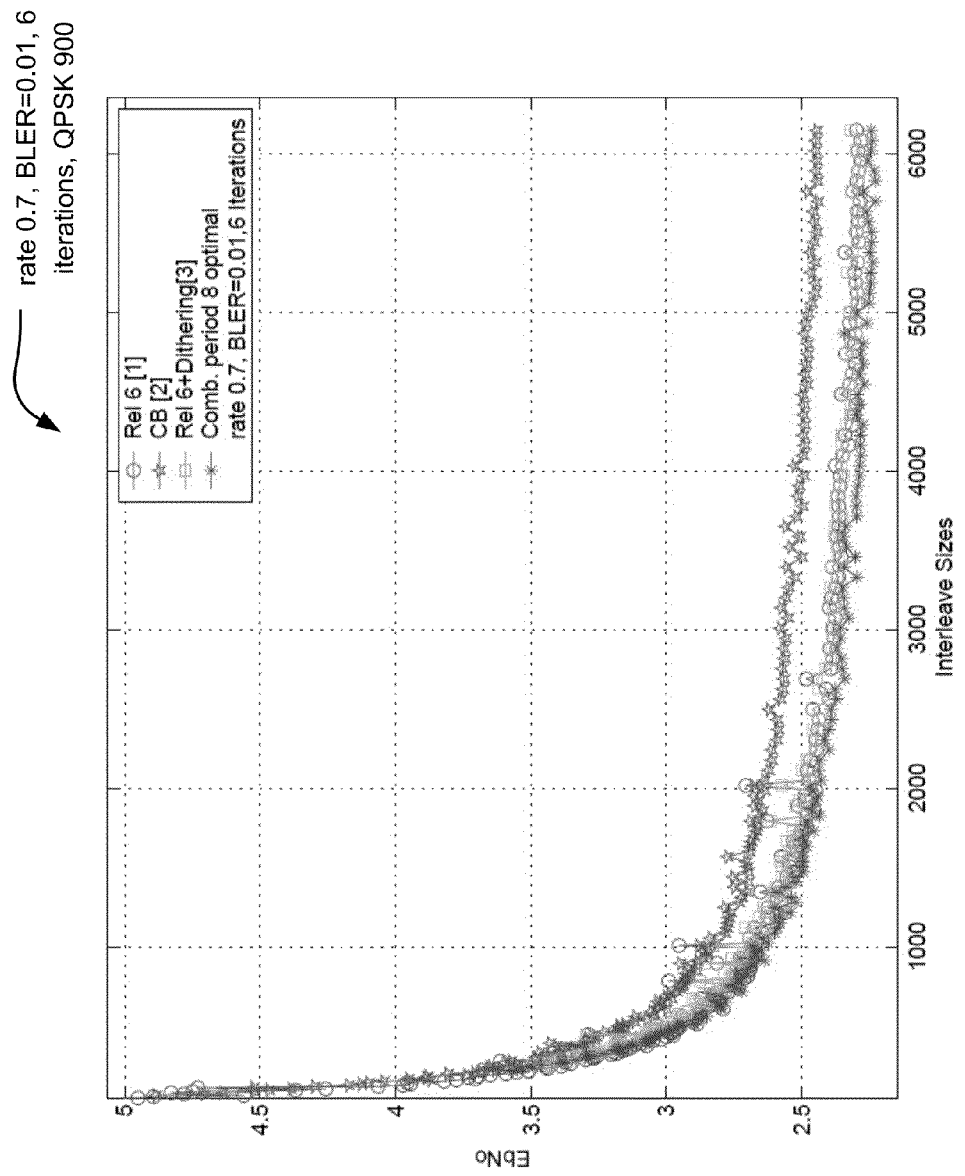
FIG. 9 illustrates an embodiment of performance comparisons (in terms of a constant BLER=0.01 of Eb/No vs. interleave sizes) of various turbo codes having a code rate of 0.8 having an interleaver ($\pi$) block size/information block size of 1120 and a code rate of 0.7.

FIG. 9 illustrates an embodiment of performance comparisons (in terms of a constant BLER=0.01 of Eb/No vs. interleave sizes) of various turbo codes having a code rate of 0.8 having an interleaver ($\pi$) block size/information block size of 1120 and a code rate of 0.7.

Figure 10:
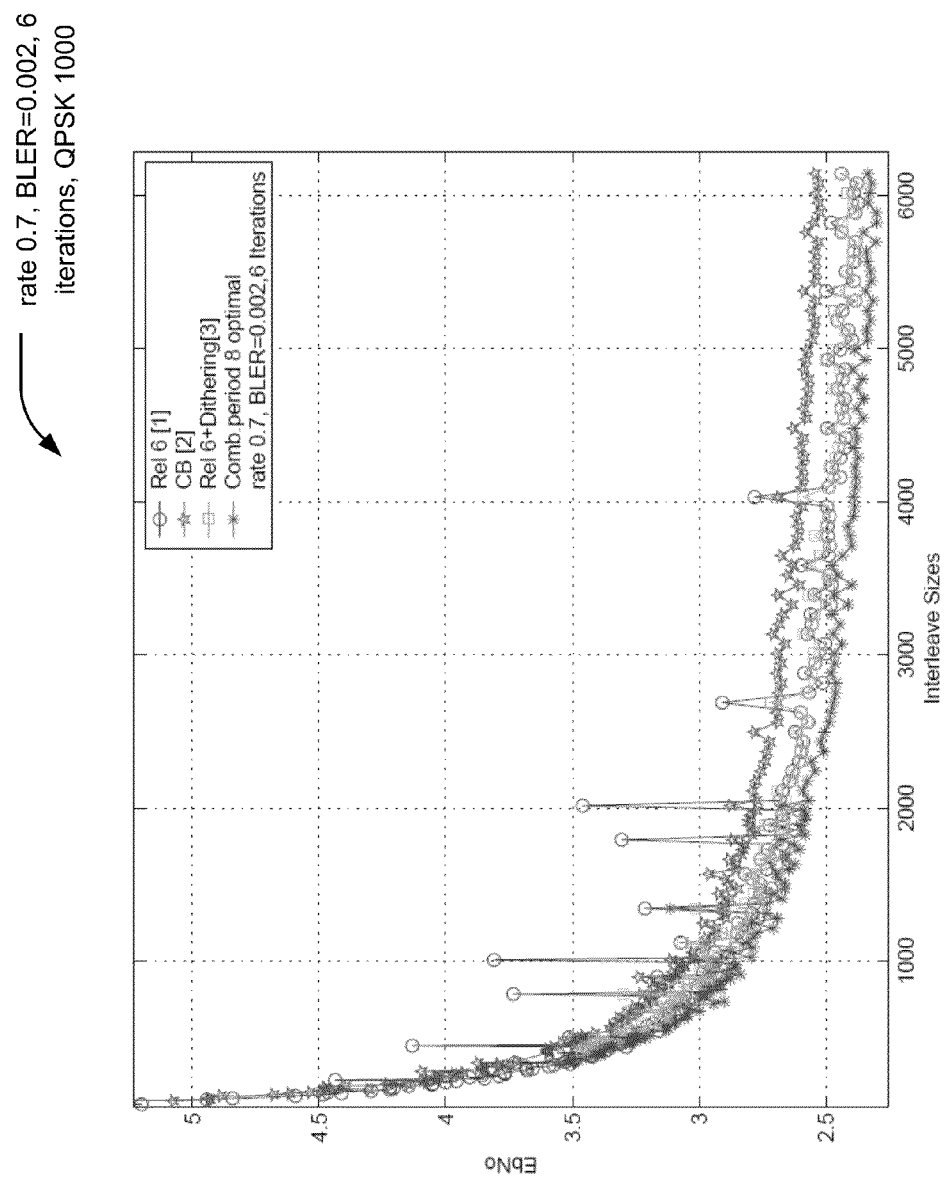
FIG. 10 illustrates an embodiment of performance comparisons (in terms of a constant BLER=0.002 of Eb/No vs. interleave sizes) of various turbo codes having a code rate of 0.8 having an interleaver ($\pi$) block size/information block size of 1120 and a code rate of 0.7.

FIG. 10 illustrates an embodiment of performance comparisons (in terms of a constant BLER=0.002 of Eb/No vs. interleave sizes) of various turbo codes having a code rate of 0.8 having an interleaver ($\pi$) block size/information block size of 1120 and a code rate of 0.7.

When comparing the FIG. 8, FIG. 9, and FIG. 10, it can be seen that the sub-optimal combined pattern of period 8 performs better (or at least comparable to) those embodiments depicted in references [1] and [3].

Some Alternative Embodiments

To get an even more optimal performance all of the 188 interleave sizes as employed in the 3GPP LTE channel coding, there are many additional possible options, including:
1) Combine more periodic puncturing rate patterns (e.g., more than merely 2 as described above in one embodiment);
2) Using Combining Method 2), i.e. using rate 8/10 and rate 8/12 period alternatively (or alternatively generally depicted as rate 8/D and rate 8/(D+2), and the case of rate 8/10 and rate 8/12 period is where D=10);
3) Using a longer period (the lower the code rate, then the longer the period that is needed);
4) Search for the optimal periodic puncturing pattern for the combination of rate 8/D and rate 8/(D+2) (e.g., search not directly for the optimal periodic puncturing rate pattern for each of two or more code rates, but for the optimal periodic puncturing rate pattern for the combination thereof this could possibly result in an extensive and burdensome search process));
5) Search for the optimal periodic puncturing pattern for the combined code rate from the combination of rate 8/D and rate 8/(D+1), for the 0.7 rate code (e.g., again search not directly for the optimal periodic puncturing rate pattern for each of two or more code rates, but for the optimal periodic puncturing rate pattern for the combination thereof)); and
6) Include the combination of many rates, and search for the optimal periodic puncturing pattern for the resultant combination of them all. Again, this approach could possibly result in an extensive and burdensome search process, but will result in the overall most optimal periodic puncturing pattern.

Tail Bit Termination:
The turbo encoder adopted by 3GPP LTE channel coding includes 12 extra tail bits added after the coded bits.

Therefore, to make the final output code rate as needed, it is therefore necessary to puncture an additional 12 bits inside the code block (i.e., to make room for the 12 extra tail bits added after the coded bits). One way to do this is to select 12 evenly distributed 12 positions on the not-yet-punctured positions and then to puncture them. Now that these 12 positions are available (i.e., after performing the puncturing of them), the 12 extra tail bits are then put in those just-punctured positions before sending out the encoded block. For example, before passing the encoded block to a symbol mapper where the symbols are mapped according to the appropriate modulation (constellation and mapping), these 12 extra tail bits are then put in those just-punctured positions. The encoded block may then be formed into a number of symbols (e.g., a number of bits grouped together) that undergo symbol mapping, and these symbol mapped symbols may then undergo any appropriate modulation as required to generate a continuous-time signal whose format comports with a communication channel into which the turbo coded signal is to be launched.

Figure 11:
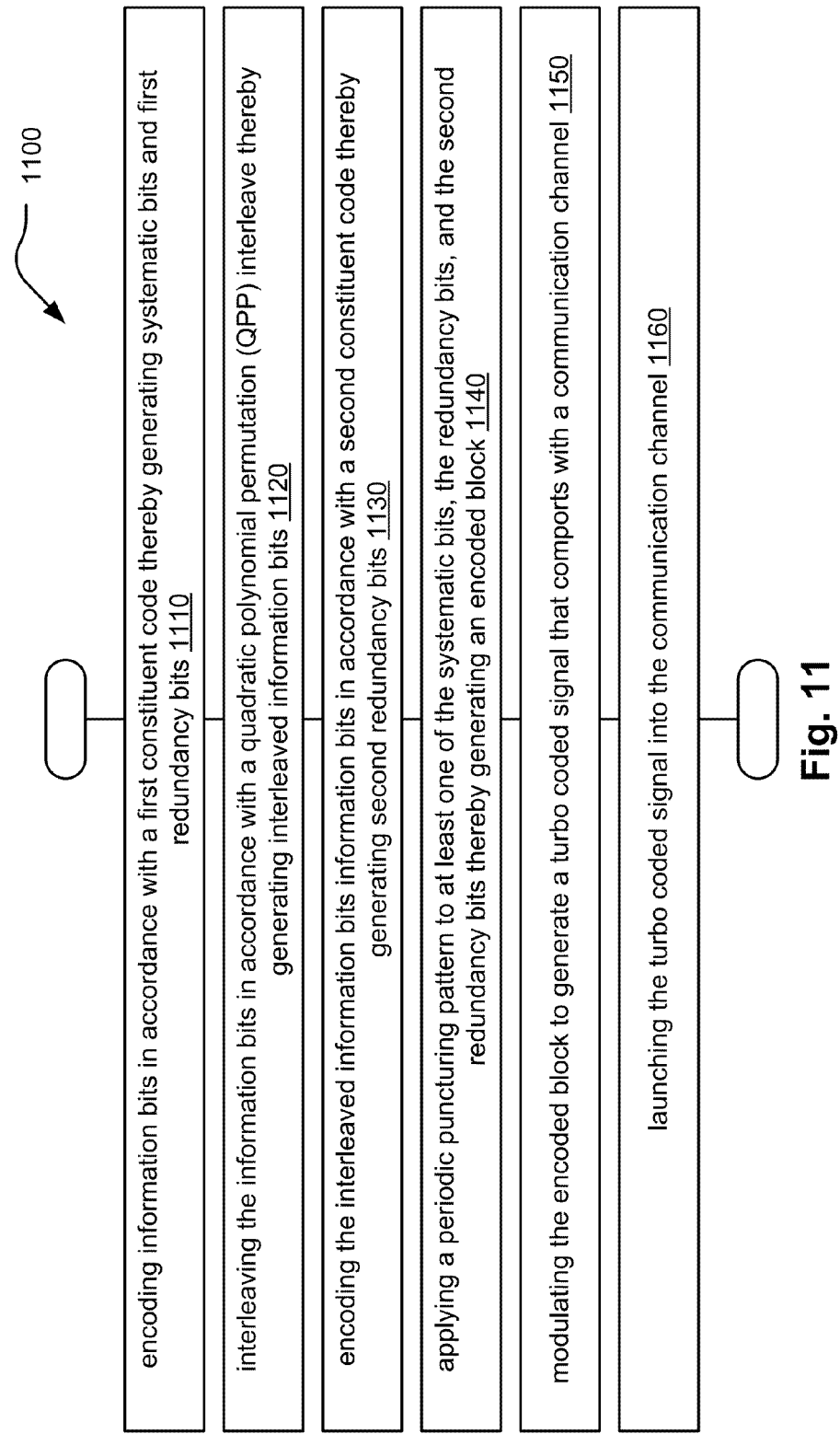
FIG. 11 illustrates an embodiment of a method for processing a signal.

FIG. 11 illustrates an embodiment of a method 1100 for processing a signal.

The method 1100 begins by encoding information bits in accordance with a first constituent code thereby generating systematic bits and first redundancy bits, as shown in a block 1110. The method 1100 continues by interleaving the information bits in accordance with a quadratic polynomial permutation (QPP) interleave thereby generating interleaved information bits, as shown in a block 1120.

The method 1100 continues by encoding the interleaved information bits in accordance with a second constituent code thereby generating second redundancy bits, as shown in a block 1130. The method 1100 continues by applying a periodic puncturing pattern to at least one of the systematic bits, the redundancy bits, and the second redundancy bits thereby generating an encoded block, as shown in a block 1140. The method 1100 continues by modulating the encoded block to generate a turbo coded signal that comports with a communication channel, as shown in a block 1150.

The method 1100 continues by launching the turbo coded signal into the communication channel, as shown in a block 1160. It is noted that the periodic puncturing pattern is operable to modify bits output from the mother encoder so that the final coded block has a predetermined rate before being launched into the communication channel.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

REFERENCES

[1] Technical Specification Group Radio Access Network; Multiplexing and channel coding (FDD) (Release 6), 3GPP TS 25.212 V6.8.0.

[2] Ericsson, LGE, Motorola, Qualcomm, Samsung and ZTE, "Circular buffer rate matching", E-mail proposal on reflector: 3GPP_TSG_RAN_WG1@LIST.ETSI.ORG, Apr. 14, 2007.

[3] Nokia Siemens Networks, Nokia, "Description of the Dithering Algorithm for LTE Rate Matching," E-mail proposal on reflector: 3GPP_TSG_RAN_WG1@LIST.ETSI.ORG, Apr. 15, 2007.

[4] Technical Specification Group Radio Access Network: Multiplexing and channel coding (release 8), (Draft) 3GPP TS 36.212 V0.4.2 (2007-02).

[5] C. Berrou, Y. Saouter, C. Douillard, S. Kerouédan, and M. Jézéquel, "Designing good permutations for turbo codes: towards a single model," 2004 *IEEE International Conference on Communications (ICC)*, Vol. 1, pp: 341-345, 20-24 Jun. 2004.

[6] O. Y. Takeshita, "On maximum contention-free interleavers and permutation polynomials over integer rings," *IEEE Trans. Information Theory*, Vol. 52, No. 3, March 2006.

What is claimed is:

1. An apparatus, comprising:
a turbo encoder configured to encode a plurality of information bits in accordance with a mother code to generate systematic bits, first redundancy bits, and second redundancy bits, wherein:
a first of a plurality of puncturing patterns is generated as a first function of the mother code, wherein the first of the plurality of puncturing patterns is applied to puncture at least one of: the systematic bits, the first redundancy bits, or the second redundancy bits, to generate a first of a plurality of turbo coded blocks having a first of a plurality of code rates; and
a second of the plurality of puncturing patterns is generated as a second function of the mother code, wherein the second of the plurality of puncturing patterns is applied to puncture the at least one of: the systematic bits, the first redundancy bits, or the second redundancy bits, to generate a second of the plurality of turbo coded blocks having a second of the plurality of code rates; and
wherein the turbo encoder shifts by at least one bit, at least one of: the first of the plurality of turbo coded blocks or the second of the plurality of turbo coded blocks; and
wherein a transmitter modulates a first of the plurality of turbo coded blocks to generate a first of a plurality of turbo coded signals during a first time and modulates a second of the plurality of turbo coded blocks to generate a second of the plurality of turbo coded signals during a second time.

2. The apparatus of claim 1, wherein:
wherein the turbo encoder shifts at least one of: the first of the plurality of turbo coded blocks or the second of the plurality of turbo coded blocks, after generating the first or the second of the plurality of turbo coded blocks, and before the first or the second of the plurality of turbo coded blocks is modulated by the transmitter.

3. The apparatus of claim 1, wherein the apparatus is a communication device operative within a satellite communication system.

4. The apparatus of claim 1, wherein the apparatus is a communication device operative within a wireless communication system.

5. The apparatus of claim 1, wherein the apparatus is a communication device operative within a wired communication system.

6. The apparatus of claim 1, wherein the apparatus is a communication device operative within at least one of a fiber-optic communication system.

7. An apparatus, comprising:
a turbo encoder configured to encode a plurality of information bits in accordance with a mother code to generate systematic bits, first redundancy bits, and second redundancy bits, wherein a plurality of puncturing patterns are applied as a respective function of the mother code, to at least one of the systematic bits, the first redundancy bits or the second redundancy bits, to generate a plurality of turbo coded blocks each having a respective one of a plurality of code rates; and
a transmitter configured to modulate respectively each of the plurality of turbo coded blocks and to generate a plurality of turbo coded signals such that each of the plurality of turbo coded signals corresponding to a respective one of a plurality of turbo coded blocks.

8. The apparatus of claim 7, wherein:
a first of the plurality of puncturing patterns, when applied to the at least one of: the systematic bits, the first redundancy bits, or the second redundancy bits, is operative to generate a first of the plurality of turbo coded blocks having a first of the plurality of code rates; and
a second of the plurality of puncturing patterns, when applied to the at least one of: the systematic bits, the first redundancy bits, or the second redundancy bits, is operative to generate a second of the plurality of turbo coded blocks having a second of the plurality of code rates.

9. The apparatus of claim 8, wherein:
the transmitter modulates the first of the plurality of turbo coded blocks to generate a first of the plurality of turbo coded signals during a first time; and the transmitter modulates the second of the plurality of turbo coded blocks to generate a second of the plurality of turbo coded signals during a second time.

10. The apparatus of claim 7, wherein:
at least one of the plurality of puncturing patterns, when applied to a sub-combination of the systematic bits, the first redundancy bits or the second redundancy bits, is operative to generate at least one of the plurality of turbo coded blocks having at least one of the plurality of code rates.

11. The apparatus of claim 7, wherein:
the at least one of the plurality of turbo coded blocks undergoes shifting by the at least one bit, after at least one of the plurality of puncturing patterns is applied to at least one of the systematic bits, the first redundancy bits or the second redundancy bits and before the at least one of the plurality of turbo coded blocks is modulated by the transmitter.

12. The apparatus of claim 7, wherein the apparatus is a communication device operative within a wireless communication system.

13. The apparatus of claim 7, wherein the apparatus is a communication device operative within a wired communication system.

14. The apparatus of claim 7, wherein the apparatus is a communication device operative within a fiber-optic communication system.

15. A method for operating a communication device, the method comprising:
turbo encoding a plurality of information bits in accordance with a mother code to generate systematic bits, first redundancy bits, and second redundancy bits, wherein a plurality of puncturing patterns is applied as a respective function of the mother code to at least one of: the systematic bits, the first redundancy bits, or the second redundancy bits, to generate a plurality of turbo coded blocks each having a respective one of a plurality of code rates; and
modulate the plurality of turbo coded blocks to generate a plurality of turbo coded signals such that the plurality of turbo coded signals correspond to a corresponding ones of the plurality of turbo coded blocks.

16. The method of claim 15, wherein:
a first of the plurality of puncturing patterns, when applied to the at least one of the systematic bits, the first redundancy bits, and the second redundancy bits, is operative to generate a first of the plurality of turbo coded blocks having a first of the plurality of code rates; and
a second of the plurality of puncturing patterns, when applied to the at least one of the systematic bits, the first redundancy bits, and the second redundancy bits, is operative to generate a second of the plurality of turbo coded blocks having a second of the plurality of code rates.

17. The method of claim 16, wherein the first of the plurality of turbo coded blocks are modulated to generate a first of the plurality of turbo coded signals during a first time; and
the second of the plurality of turbo coded blocks are modulated to generate a second of the plurality of turbo coded signals during a second time.

18. The method of claim 15, wherein
the at least one of the plurality of turbo coded blocks undergoes shifting by the at least one bit, after at least one of the plurality of puncturing patterns is applied to at least one of the systematic bits, the first redundancy bits or the second redundancy bits and before the at least one of the plurality of turbo coded blocks is modulated.

19. The method of claim 15, wherein the communication device is operative within a wireless communication system.

20. The method of claim 15, wherein the communication device is operative within a wired communication system.

* * * * *